(12) United States Patent
Hashimoto

(10) Patent No.: US 7,230,341 B2
(45) Date of Patent: Jun. 12, 2007

(54) ELECTRONIC DEVICE AND METHOD OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 11 days.

(21) Appl. No.: 10/788,449

(22) Filed: Mar. 1, 2004

(65) Prior Publication Data

US 2004/0227235 A1 Nov. 18, 2004

(30) Foreign Application Priority Data

Mar. 13, 2003 (JP) ............................. 2003-068279

(51) Int. Cl.
*H01L 23/28* (2006.01)
(52) U.S. Cl. .................. 257/787; 257/686; 257/777
(58) Field of Classification Search ................ 257/787, 257/686, 777
See application file for complete search history.

(56) References Cited

U.S. PATENT DOCUMENTS

| 6,621,172 B2 * | 9/2003 | Nakayama et al. .......... 257/787 |
| 6,638,781 B1 * | 10/2003 | Hirakata et al. ............... 438/30 |
| 2005/0110124 A1 * | 5/2005 | Song et al. .................. 257/678 |

FOREIGN PATENT DOCUMENTS

| JP | A 1-164044 | 0/0000 |
| JP | A 58-073126 | 5/1983 |
| JP | A 60-244035 | 12/1985 |
| JP | A 1-164004 | 6/1989 |
| JP | A 4-350951 | 12/1992 |
| JP | A 9-051020 | 2/1997 |
| JP | A 10-223700 | 8/1998 |
| JP | A 2000-216330 | 8/2000 |
| JP | A 2001-250843 | 9/2001 |

OTHER PUBLICATIONS

New U.S. Appl. No. 10/788,295, Mar. 01, 2004, Hashimoto.
New U.S. Appl. No. 10/788,492, Mar. 01, 2004, Hashimoto.
New U.S. Appl. No. 10/788,447, Mar. 01, 2004, Hashimoto.

* cited by examiner

*Primary Examiner*—Long Pham
(74) *Attorney, Agent, or Firm*—Oliff & Berridge, PLC

(57) ABSTRACT

An electronic device includes: a substrate on which an interconnect pattern is formed; a chip component having a first surface on which an electrode is formed and a second surface opposite to the first surface, the chip component being mounted in such a manner that the second surface faces the substrate; an insulating section formed of a resin and provided adjacent to the chip component; and an interconnect which is formed to extend from above the electrode, over the insulating section and to above the interconnect pattern.

18 Claims, 7 Drawing Sheets

ELECTRONIC DEVICE AND METHOD OF MANUFACTURING THE SAME, CIRCUIT BOARD, AND ELECTRONIC INSTRUMENT

Japanese Patent Application No. 2003-68279, filed on Mar. 13, 2003, is hereby incorporated by reference in its entirety.

BACKGROUND OF THE INVENTION

The present invention relates to an electronic device and a method of manufacturing the same, a circuit board, and also an electronic instrument.

With conventional chip-on-board (COB) mounting, the use of high temperatures require the substrate to have thermal resistivity, making it impossible to use a thermoplastic substrate. This makes it difficult to use an inexpensive substrate. In addition, since a semiconductor chip is subjected to external thermal or mechanical forces, it is difficult to avoid defects caused by the resultant stresses. When wire bonding is used, there are restrictions on the lengths of wires, so a general-purpose substrate cannot be used. Alternatively, if face-down bonding is used, it is necessary to use a special substrate that is matched to the layout of the electrodes of the semiconductor chip, so it is not possible to use a general-purpose substrate therefore.

BRIEF SUMMARY OF THE INVENTION

An electronic device according one aspect of the present invention includes:

a substrate on which an interconnect pattern is formed;

a chip component having a first surface on which an electrode is formed and a second surface opposite to the first surface, the chip component being mounted in such a manner that the second surface faces the substrate;

an insulating section formed of a resin and provided adjacent to the chip component; and an interconnect which is formed to extend from above the electrode, over the insulating section and to above the interconnect pattern.

An electronic device according another aspect of the present invention includes:

a substrate on which an interconnect pattern is formed;

a chip component having a first surface on which an electrode is formed and a second surface opposite to the first surface, the chip component being mounted in such a manner that the second surface faces the substrate;

an insulating section provided adjacent to the chip component and having an inclined surface descending in an outward direction from the chip component; and an interconnect which is formed to extend from above the electrode, over the insulating section and to above the interconnect pattern.

A method of manufacturing an electronic device according to a further aspect of the present invention includes:

mounting a chip component having an electrode on a substrate on which an interconnect pattern is formed, in such a manner that a second surface faces the substrate, the electrode being formed on a first surface and the second surface being opposite to the first surface;

forming an insulating section of a resin adjacent to the chip component; and forming an interconnect in such a manner as to extend from above the electrode, over the insulating section and to above the interconnect pattern.

A method of manufacturing an electronic device according to a still further aspect of the present invention includes:

mounting a chip component having an electrode on a substrate on which an interconnect pattern is formed, in such a manner that a second surface faces the substrate, the electrode being formed on a first surface and the second surface being opposite to the first surface;

forming an insulating section of a resin adjacent to the chip component in such a manner that the insulating section has an inclined surface descending in an outward direction from the chip component; and forming an interconnect in such a manner as to extend from above the electrode, over the insulating section and to above the interconnect pattern.

A circuit board according to a yet further aspect of the present invention has the above electronic device mounted thereon.

An electronic instrument according to an even further aspect of the present invention has the above electronic device.

DETAILED DESCRIPTION OF THE EMBODIMENT

Figure 1:
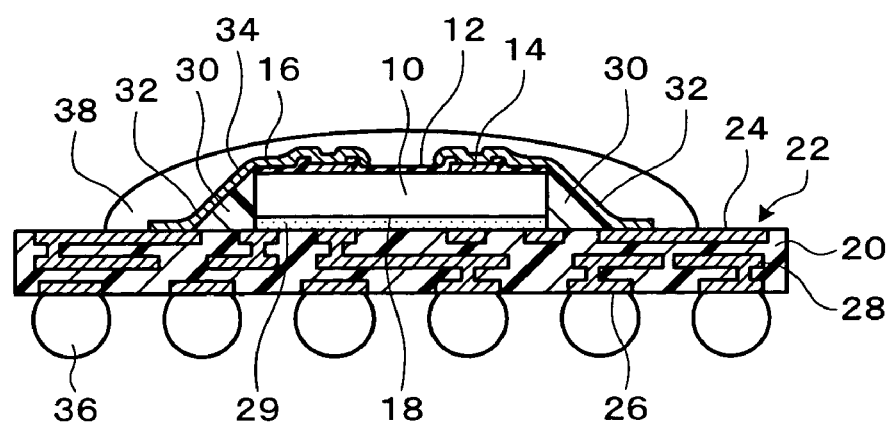
FIG. 1 is a sectional-view taken along the line I—I of FIG. 2.

An embodiment of the present invention may reduce the requirement of thermal resistivity of the substrate, enable a reduction in the generation of stresses in the semiconductor chip, and make it possible to use a general-purpose substrate.

(1) An electronic device according one embodiment of the present invention include:

a substrate on which an interconnect pattern is formed;

a chip component having a first surface on which an electrode is formed and a second surface opposite to the first surface, the chip component being mounted in such a manner that the second surface faces the substrate;

an insulating section formed of a resin and provided adjacent to the chip component; and an interconnect which is formed to extend from above the electrode, over the insulating section and to above the interconnect pattern.

This embodiment of the present invention makes it possible to avoid the use of high-temperature heating such as that used for wire bonding or face-down bonding, when the electrodes are being connected electrically to the interconnect pattern. The requirement of thermal resistivity for the substrate is therefore reduced, enabling a reduction in the stresses generated in the chip component. In addition, the interconnect can be formed freely, enabling the use of a general-purpose substrate.

(2) With this electronic device, a side surface of the chip component may be inclined to descend in an outward direction from the first surface.

(3) With this electronic device, the chip component may have a step in an edge portion of the chip component.

(4) An electronic device according to another embodiment of the present invention includes:

a substrate on which an interconnect pattern is formed;

a chip component having a first surface on which an electrode is formed and a second surface opposite to the first surface, the chip component being mounted in such a manner that the second surface faces the substrate;

an insulating section provided adjacent to the chip component and having an inclined surface descending in an outward direction from the chip component; and an interconnect which is formed to extend from above the electrode, over the insulating section and to above the interconnect pattern.

This embodiment of the present invention makes it possible to avoid the use of high-temperature heating such as that used for wire bonding or face-down bonding, when the electrodes are being connected electrically to the interconnect pattern. The requirement of thermal resistivity for the substrate is therefore reduced, enabling a reduction in the stresses generated in the chip component. In addition, the interconnect can be formed freely, enabling the use of a general-purpose substrate.

(5) With this electronic device, the inclined surface may be a depressed surface.

(6) With this electronic device, the inclined surface may be a projected surface.

(7) With this electronic device, the insulating section may be formed so that part of the insulating section overlays the first surface.

(8) With this electronic device, the insulating section may be formed so that part of the insulating section does not overlay the first surface.

(9) With this electronic device, the insulating section may have a portion higher than the first surface.

(10) This electronic device may further include a connection layer that connects the chip component with the substrate.

(11) With this electronic device, the connection layer may be formed of the same material as the insulating section.

(12) With this electronic device, the connection layer may be formed of a material different from a material of the insulating section.

(13) A method of manufacturing an electronic device according to a further embodiment of the present invention includes:

mounting a chip component having an electrode on a substrate on which an interconnect pattern is formed, in such a manner that a second surface faces the substrate, the electrode being formed on a first surface and the second surface being opposite to the first surface;

forming an insulating section of a resin adjacent to the chip component; and forming an interconnect in such a manner as to extend from above the electrode, over the insulating section and to above the interconnect pattern.

This embodiment of the present invention makes it possible to avoid the use of high-temperature heating such as that used for wire bonding or face-down bonding, when the electrodes are being connected electrically to the interconnect pattern. The requirement of thermal resistivity for the substrate is therefore reduced, enabling a reduction in the stresses generated in the chip component. In addition, the interconnect can be formed freely, enabling the use of a general-purpose substrate.

(14) A method of manufacturing an electronic device according to a still further embodiment of the present invention includes:

mounting a chip component having an electrode on a substrate on which an interconnect pattern is formed, in such a manner that a second surface faces the substrate, the electrode being formed on a first surface and the second surface being opposite to the first surface;

forming an insulating section of a resin adjacent to the chip component in such a manner that the insulating section has an inclined surface descending in an outward direction from the chip component; and forming an interconnect in such a manner as to extend from above the electrode, over the insulating section and to above the interconnect pattern.

This embodiment of the present invention makes it possible to avoid the use of high-temperature heating such as that used for wire bonding or face-down bonding, when the electrodes are being connected electrically to the interconnect pattern. The requirement of thermal resistivity for the substrate is therefore reduced, enabling a reduction in the stresses generated in the chip component. In addition, the interconnect can be formed freely, enabling the use of a general-purpose substrate.

(15) With this method of manufacturing an electronic device, the interconnect may be formed of a dispersant including electrically conductive particles.

(16) With this method of manufacturing an electronic device, the step of forming the interconnect may include ejecting the dispersant including the electrically conductive particles over the electrode, the insulating section and the interconnect pattern.

(17) With this method of manufacturing an electronic device, the step of mounting the chip component on the substrate may include interposing an adhesive between the substrate and the chip component.

(18) With this method of manufacturing an electronic device, an insulating adhesive may be used as the adhesive; and the adhesive may be pressed out from between the substrate and the chip component to a region adjacent to the chip component, to form the insulating section from the adhesive.

(19) With this method of manufacturing an electronic device, the step of forming the insulating section may include providing a material to form the insulating section besides the adhesive.

(20) A circuit board according to a yet further embodiment of the present invention has the above electronic device mounted thereon.

(21) An electronic instrument according to an even further embodiment of the present invention has the above electronic device.

An embodiment of the present invention is described below with reference to the accompanying figures.

Figure 2:
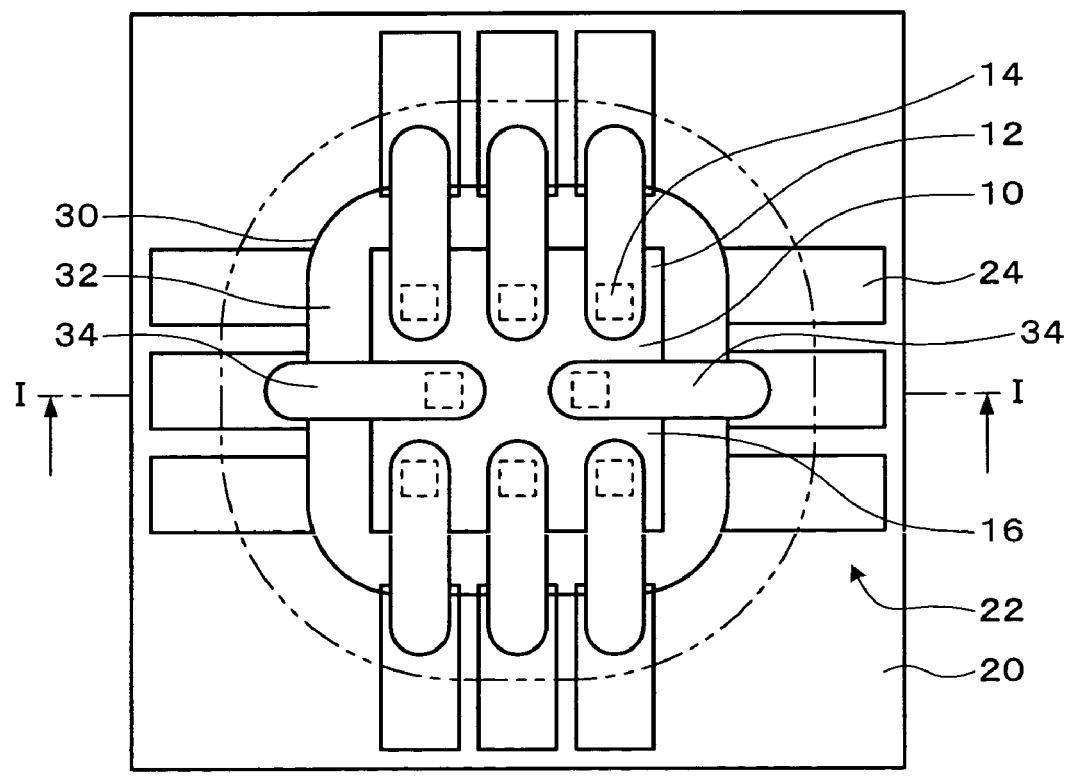
FIG. 2 is a plan view of an electronic device in accordance with an embodiment of the present invention.

An illustrative view of an electronic device in accordance with an embodiment of the present invention is shown in FIG. 1, as a sectional-view taken along the line I—I in FIG. 2. FIG. 2 is a plan view of the electronic device in accordance with this embodiment of the present invention.

The electronic device has a chip component 10. The chip component 10 could be an active component (such as an integrated circuit component) of a semiconductor component (such as a semiconductor chip), by way of example. An integrated circuit (not shown in the figures) could be formed in the chip component 10. If the chip component 10 is a semiconductor chip, the electronic device could be called a semiconductor device. The chip component 10 could also be a passive component (such as a resistor, capacitor, or inductor).

A plurality of electrodes 14 is formed on a first surface 12 of the chip component 10. The first surface 12 could be a quadrilateral (such as a rectangle). The plurality of electrodes 14 could be formed along a peripheral portion (edge portion) of the first surface 12. The plurality of electrodes 14 could be disposed along four edges of the first surface 12, or they could be disposed along two edges. At least one electrode 14 could be disposed at a central portion of the first surface 12.

A passivation film 16 including at least one layer could be formed on the first surface 12. The passivation film 16 is an electrically insulating film. The passivation film 16 could be formed solely of a material that is not a resin (such as $SiO_2$ or SiN), or it could further include a film of a resin (such as a polyimide resin) formed thereover. An aperture that exposes at least part of each electrode 14 (such as a central portion thereof) is formed in the passivation film 16. In other words, the passivation film 16 is formed to avoid at least the central portion of each electrode 14. The passivation film 16 could cover the edge portions of the electrode 14. The passivation film 16 could also be formed to cover the entire peripheral portion of the first surface 12.

Electrodes are not formed on a second surface 18 of the chip component 10 (on the surface opposite to that of the first surface 12). The second surface 18 could be in electrical contact with an integrated circuit (not shown in the figure), or it could be not connected thereto. A passivation film (electrically insulating film) could be formed on the second surface 18 or it could be omitted therefrom. The second surface 18 could be formed of a semiconductor (or conductor). A passivation film (electrically insulating film) could also be formed on the side surfaces of the chip component 10 (the surfaces other than the first and second surfaces 12 and 18) or it could be omitted therefrom. Electrodes are not formed on the side surfaces of the chip component 10. The side surfaces of the chip component 10 could also be formed of a semiconductor (or conductor).

The electronic device has a substrate 20. An interconnect pattern 22 is formed on the substrate 20. The interconnect pattern 22 includes an exposed portion 24 that reveals part of the surface of the substrate 20. An interconnect 34 for providing electrical connections between the chip component 10 and the interconnect pattern 22 is formed on the exposed portion 24. The exposed portion 24 could also have a land (a portion that is wider than a line; not shown in the figures).

The substrate 20 on which the interconnect pattern 22 is formed could be termed a wiring board. A wiring board could be a multi-layer board (including a two-sided board). A multi-layer board includes multiple (two or more) conductor patterns. In this case, the interconnect pattern 22 could also include a second exposed portion 26 that reveals a second surface on the opposite side from the surface that the exposed portion 24 reveals. The interconnect pattern 22 could also include a conductor pattern 28 within the substrate 20. The wiring board could also be a wiring board incorporated in a component. More specifically, passive components such as resistors, capacitors, and inductors or active components such as integrated circuit components could be connected electrically to the conductor pattern 28 within the substrate 20. Alternatively, part of the conductor pattern 28 could be formed into a resistor by forming it of a high-resistance material.

The chip component 10 is mounted on the substrate 20. The second surface 18 of the chip component 10 faces the substrate 20 (specifically, the surface on which the exposed portion 24 is formed). A connection layer 29 could be interposed between the chip component 10 and the substrate 20. The connection layer 29 could be formed of an adhesive. The exposed portion 24 and the second surface 18 of the chip component 10 can be connected electrically by making the connection layer 29 electrically conductive. Alternatively, the exposed portion 24 and the second surface 18 of the chip component can be isolated electrically by making the connection layer 29 electrically insulating. The connection layer 29 could be formed of a material that is an electrically insulating dispersant including electrically conductive particles.

The electronic device has an insulating section 30. The insulating section 30 is formed of a material that is electrically insulating (such as a resin). The insulating section 30 could be formed of a material that differs from that of the connection layer 29. The insulating section 30 is provided adjacent to the chip component 10. The insulating section 30 could be provided so as to surround the chip component 10, or it could be provided only in a region adjacent to each electrode 14 of the chip component 10. The insulating section 30 could also be placed in contact with the side surfaces of the chip component 10. In other words, the configuration could be such that there is no space between the insulating section 30 and the chip component 10. In the example shown in FIG. 1, the insulating section 30 is provided in such a fashion that it does not surpass the height of the chip component 10. The upper edge of the insulating section 30 could be at the same height as the upper surface of the chip component 10 (the surface of the passivation film 16). In such a case, there is no step between the insulating section 30 and the chip component 10. The configuration could be such that only portions of the side surfaces of the chip component 10 that are formed of a semiconductor or conductor are covered with the insulating section 30. In such a case, the upper edge of the insulating section 30 is set lower than the upper surface of the passivation film 16.

The insulating section 30 has an inclined surface 32 that descends in the outward direction from the chip component 10. The thickest part of the insulating section 30 is positioned closest to the chip component 10 and the thinnest part thereof is positioned at the farthermost point from the chip component 10. The insulating section 30 could be formed over part of the interconnect pattern 22 (specifically, the exposed portion 24 thereof).

The electronic device has an interconnect 34. Part of the interconnect 34 is formed over each electrode 14. The interconnect 34 could also pass over the passivation film 16. The interconnect 34 passes over the insulating section 30. If the insulating section 30 is formed of a resin, the sealing between the insulating section 30 and the interconnect 34 is higher than that between the passivation film 16 and the interconnect 34. It is possible to prevent breakage of the interconnect 34 by minimizing the difference in height between the chip component 10 (such as the passivation film 16 thereof) and the insulating section 30. The interconnect 34 is formed so as to be above the interconnect pattern 22 (specifically, the exposed portion 24 thereof). In other words, the interconnect 34 connects the electrode 14 with the interconnect pattern 22 electrically.

The electronic device could be provided with a plurality of external terminals 36. The external terminals 36 could be provided above the interconnect pattern 22 (such as in the second exposed portion 26). The external terminals 36 could be formed of a soldering material. A soldering material is a metal (such as an alloy) which is electrically conductive and which is designed to create an electrical connection on melting. The soldering material could be either a soft solder or a hard solder. A solder that does not include lead (hereinafter called a lead-free solder) could be used as the soldering material. A tin-silver (Sn—Ag), tin-bismuth (Sn—Bi), tin-zinc (Sn—Zn), or tin-copper (Sn—Cu) alloy could be used as the lead-free solder, and at least one of silver, bismuth, zinc, and copper could be added to that alloy.

Known packages that have such external terminals 36 are ball-grid array (BGA) packages and chip-size packages (CSP). Alternatively, another known type of package is a land-grid array (LGA) package that is not provided with the external terminals 36 but part of the interconnect pattern 22 (such as the second exposed section 26) forms an electrical connective portion with the exterior.

The electronic device could also have a sealing member 38. The sealing member 38 seals at least the electrical connective portion between the interconnect 34 and each electrode 14 and the electrical connective portion between the interconnect 34 and the interconnect pattern 22. The sealing member 38 could also seal in the chip component 10.

Figure 3A:
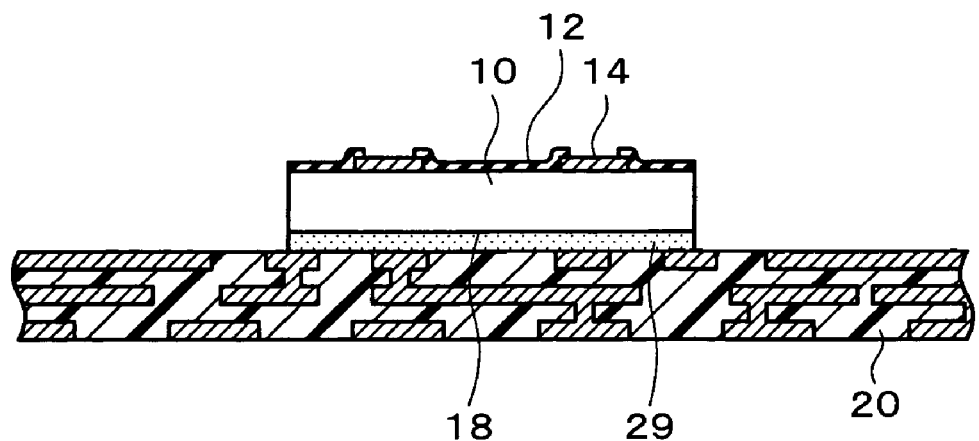
FIGS. 3A to 3C are illustrative of a method of manufacturing an electronic device in accordance with the present invention.
Figure 3B:
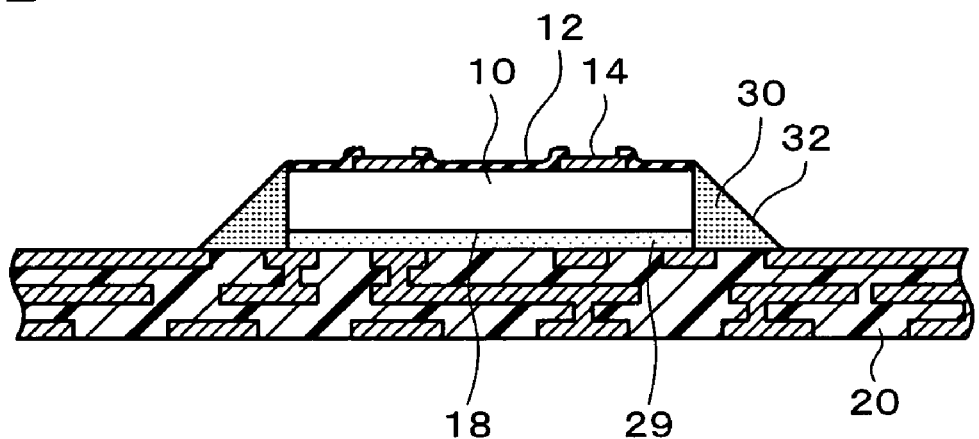
Figure 3C:
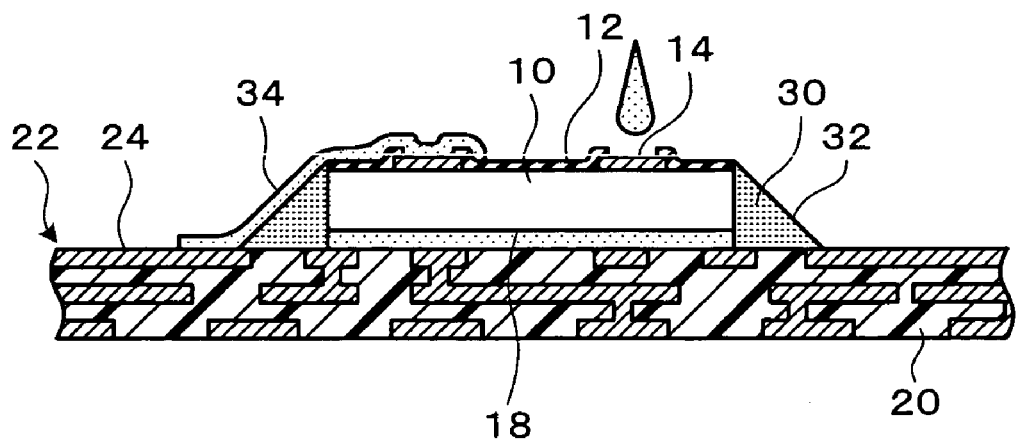

FIGS. 3A to 3C are illustrative of a method of manufacturing an electronic device in accordance with the present invention, with the chip component 10 being mounted on the substrate 20 as shown in FIG. 3A. Specifically, the chip component 10 is mounted so that the second surface 18 thereof faces the substrate 20. An adhesive could be interposed between the substrate 20 and the chip component 10, to form the connective layer 29.

As shown in FIG. 3B, the insulating section 30 is formed adjacent to the chip component 10. The insulating section 30 could be formed of a material that differs from the adhesive that forms the connection layer 29. The insulating section 30 could be formed of a resin such as a polyimide resin, a silicone denatured polyimide resin an epoxy resin, a silicone denatured epoxy resin, benzocyclobutene (BCB), or polybenzoxazole (PBO). The insulating section 30 could be formed by potting with a liquid resin, or it could be formed by fixing a dry film. The insulating section 30 is formed to have the inclined surface 32 that descends outward from the chip component 10. The insulating section 30 could also be formed to be in contact with the side surfaces of the chip component 10.

As shown in FIG. 3C, the interconnect 34 is formed. The interconnect 34 is formed so as to extend from above each electrode 14, passing over the insulating section 30, and to above the interconnect pattern 22 (such as the exposed portion 24 thereof). The interconnect 34 could be formed of a dispersant including electrically conductive particles. An inkjet method could be used therefor, by way of example. More specifically, a dispersant including electrically conductive particles could be ejected over the electrode 14, the insulating section 30, and the interconnect pattern 22 (such as the exposed portion 24), to form the interconnect 34. The process of forming the interconnect 34 could include the removal of the dispersant medium by drying the dispersant that includes the electrically conductive particles. The process of forming the interconnect 34 could also include the thermal decomposition of a coating material that covers the electrically conductive particles. The process of forming the interconnect 34 could also include a step of polymerizing the electrically conductive particles. The electrically conductive particles could be nanoparticles. In such a case, the volume resistivity of the dispersant can be reduced.

The sealing member 38 could be provided, as shown in FIG. 1. The sealing member 38 could be formed by a transfer mold or by potting The sealing member 38 could also be omitted.

When the electrode 14 and the interconnect pattern 22 in accordance with this embodiment are connected electrically, it is possible to avoid using high-temperature heating such as that used during wire bonding or face-down bonding. The requirement that the substrate 20 should have thermal resistivity is therefore reduced, enabling a reduction in the stresses generated in the chip component 10. A general-purpose substrate can be used as the substrate 20, making it possible to route the interconnect 34 to suit the chip component 10 (such as the arrangement of the electrodes 14 thereof). In such a case, the interconnect 34 could connect different portions of the interconnect pattern 22, depending on the type of chip component 10.

FIGS. 4 to 13 show modifications of the electronic device in accordance with further embodiments of the present invention.

Figure 4:
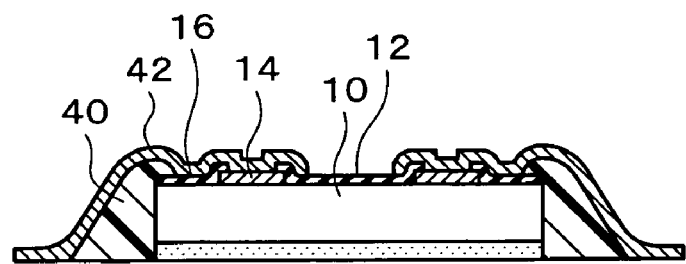
FIG. 4 shows a modification of the electronic device in accordance with an embodiment of the present invention.

In FIG. 4, an insulating section 40 is formed so that part thereof rises up over the first surface 12 of the chip component 10 (specifically, the passivation film 16 thereof). Part of the insulating section 40 overlays a portion closer to the peripheral side of the electrode 14 of the chip component 10. To prevent the electrode 14 being covered by the insulating section 40, the insulating section 40 could be made to stop at a position some distance from the electrode 14 (at a position nearer the periphery than the electrode). Alternatively, the insulating section 40 could be formed adjacent to the portion of the electrode 14 that is exposed from the passivation film 16. In such a case, the interconnect 42 does not overlay the passivation film 16 that has a low sealing capacity therewith. The insulating section 40 has a portion in contact with the chip component 10 that rises above the first surface 12. The rest of the configuration is the same as that of the electronic device of FIG. 1.

Figure 5:
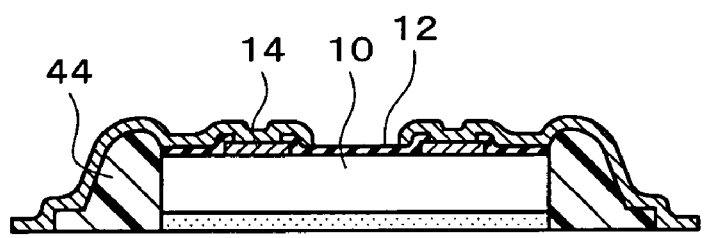
FIG. 5 shows another modification of the electronic device in accordance with an embodiment of the present invention.

In FIG. 5, an insulating section 44 is formed so that part thereof does not overlay the first surface 12 of the chip component 10. The insulating section 44 has a portion in contact with the chip component 10 that rises above the first surface 12. The insulating section 44 has a step-shaped portion on the side opposite to the chip component 10. The rest of the configuration is the same as that of the electronic device of FIG. 1.

Figure 6:
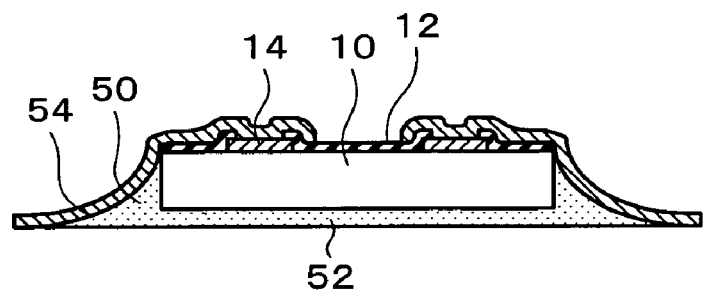
FIG. 6 shows a further modification of the electronic device in accordance with an embodiment of the present invention.

In FIG. 6, an insulating section 50 and a connection layer 52 are formed integrally. The connection layer 52 is formed of the same material as the insulating section 50. The insulating section 50 and the connection layer 52 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 54 of the insulating section 50 is a depressed surface (such as a concave surface that draws a curve as seen in a section perpendicular to the first surface 12). The rest of the configuration is the same as that of the electronic device of FIG. 1. The configuration of FIG. 6 can also be used in other embodiments or modifications.

Figure 7:
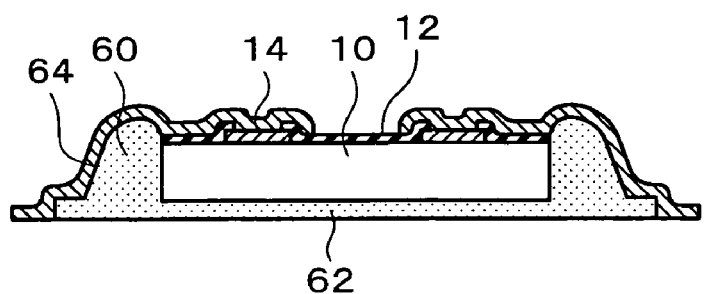
FIG. 7 shows a still further modification of the electronic device in accordance with an embodiment of the present invention.

In FIG. 7, an insulating section 60 and a connection layer 62 are formed integrally. The connection layer 62 is formed of the same material as the insulating section 60. The insulating section 60 and the connection layer 62 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 64 of the insulating section 60 is a projected surface (such as a convex surface that draws a curve as seen in a section perpendicular to the first surface 12). The rest of the configuration is the same as that of the electronic device of FIG. 1. The configuration of FIG. 7 can also be used in other embodiments or modifications.

Figure 8:
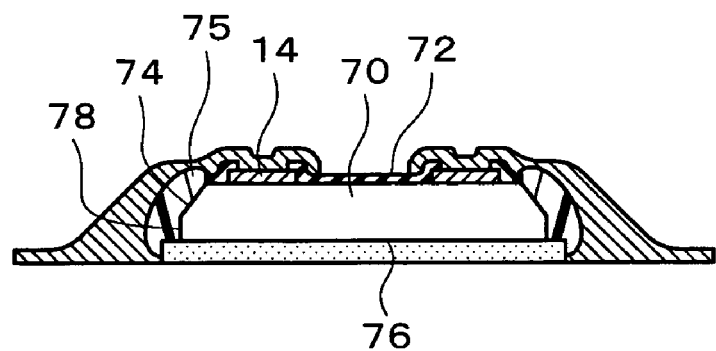
FIG. 8 shows a yet further modification of the electronic device in accordance with an embodiment of the present invention.

In FIG. 8, a chip component 70 has a side surface 74 that is inclined so as to descend in the outward direction from a first surface 72 thereof (a surface on which the electrodes 14 are formed). Since the side surface 74 is inclined, it is easy to provide an insulating section 75 with an inclined surface thereon. The chip component 70 could also include a side surface 78 that rises perpendicularly from the second surface 76 opposite to the first surface 72. The side surfaces 74 and 78 could also be connected. The rest of the configuration is the same as that of the electronic device of FIG. 1. The configuration of FIG. 8 can also be used in other embodiments or modifications.

Figure 9A:
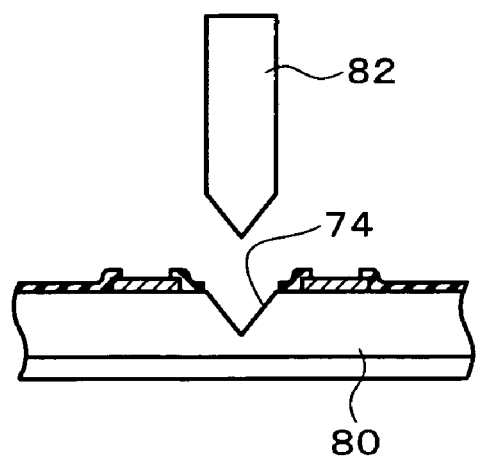
FIGS. 9A and 9B are illustrative of a method of manufacturing a chip component shown in FIG. 8.
Figure 9B:
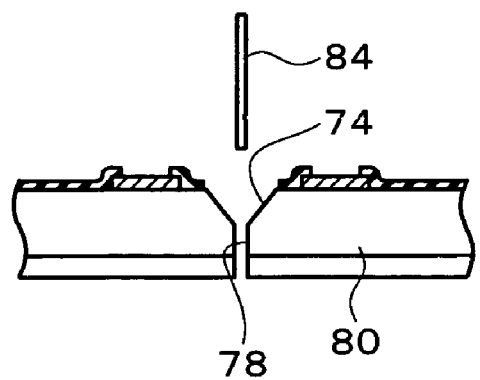

The side surface 74 could be formed when the wafer (such as a semiconductor wafer) 80 is cut apart, as shown in FIG. 9A. More specifically, a cutter (such as a dicing saw) 82 in which two slicing blades are connected at an angle like an angle milling cutter could be used to form a groove (such as a V-shaped groove) having inclined surfaces in the wafer 80, where these inclined surfaces become the side surfaces 74. After the groove has been formed, the base of the groove could be cut by a cutter (such as a dicing saw) 84 having a slicing blade along the external peripheral surfaces. This makes it possible to form the side surface 78 that rises perpendicularly from the second surface 76.

Figure 10:
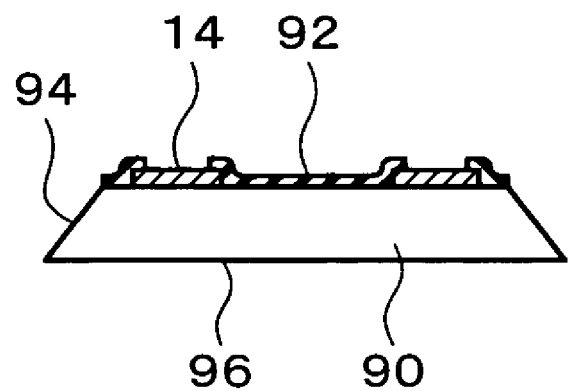
FIG. 10 shows a modification of the electronic device in accordance with an embodiment of the present invention.

In FIG. 10 a side Surface 94 of a chip component 90 is inclined so as to descend in the outward direction from a first surface (a surface on which the electrodes 14 are formed) 92. The side surface 94 is also inclined with respect to a second surface 96 on the opposite side from the first surface 92. The rest of the configuration is the same as that of the electronic device of FIG. 1. The configuration of FIG. 10 can also be used in other embodiments or modifications.

Figure 11:
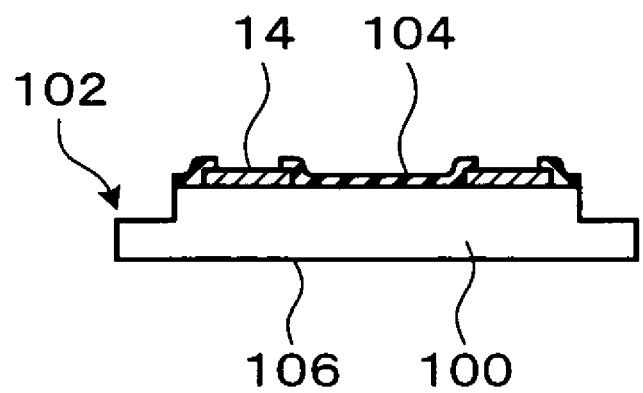
FIG. 11 shows another modification of the electronic device in accordance with an embodiment of the present invention.

In FIG. 11, an edge portion of a chip component 100 has a step 102. The step 102 includes a surface that descends (such as perpendicularly) from a first surface (a surface on which the electrodes 14 are formed) 104, a surface that rises (such as perpendicularly) from a second surface 106 opposite to the first surface 104, and a surface that extends in the lateral direction (such as parallel to either the first or second surface 104 or 106) to connect the other two surfaces. The rest of the configuration is the same as that of the electronic device of. FIG. 1. The configuration of FIG. 11 can also be used in other embodiments or modifications.

Figure 12:
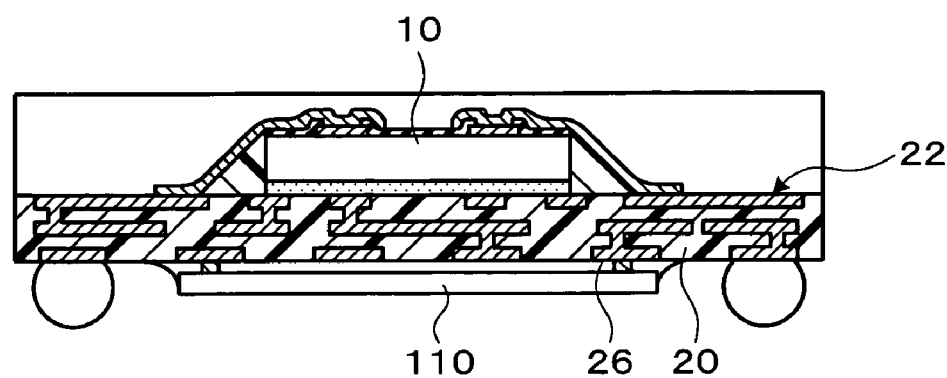
FIG. 12 shows a further modification of the electronic device in accordance with an embodiment of the present invention.

In FIG. 12, a second chip component 110 is mounted on a surface of the substrate 20 on the opposite side from the surface on which the chip component 10 is lo mounted. The second chip component 110 is connected electrically to the interconnect pattern 22 (specifically, the second exposed portion 26). The mounting state of the second chip component 110 could be either face-down bonding or face-up bonding. With face-down bonding, the electrodes (bumps) of the second chip component 110 face the interconnect pattern 22 and are electrically connected thereto. With face-up bonding, wires could be used to form the electrical connections. The rest of the configuration is the same as that of the electronic device of FIG. 1. The configuration of FIG. 12 can also be used in other embodiments or modifications.

Figure 13:
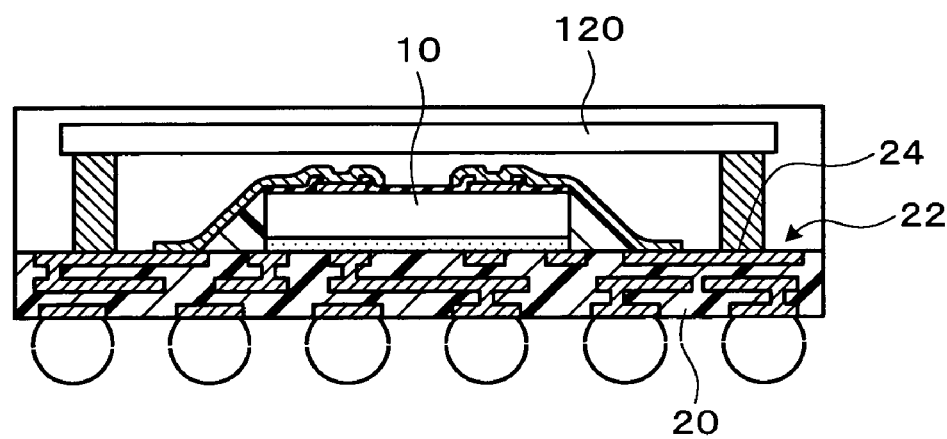
FIG. 13 shows a still further modification of the electronic device in accordance with an embodiment of the present invention.

In FIG. 13, a second chip component 120 is mounted on a surface of the substrate 20 on which the chip component 10 is mounted. The second chip component 120 could be disposed higher than the chip component 10 (or to cover the chip component 10), by way of example. The second chip component 120 is connected electrically to the interconnect pattern 22 (specifically, the exposed portion 24). The mounting state of the second chip component 120 could be either face-down bonding or face-up bonding. With face-down bonding, the electrodes (bumps) of the second chip component 120 face the interconnect pattern 22 and are electrically connected thereto. With face-up bonding, wires could be used to form the electrical connections. The rest of the configuration is the same as that of the electronic device of FIG. 1. The configuration of FIG. 13 can also be used in other embodiments or modifications.

Figure 14:
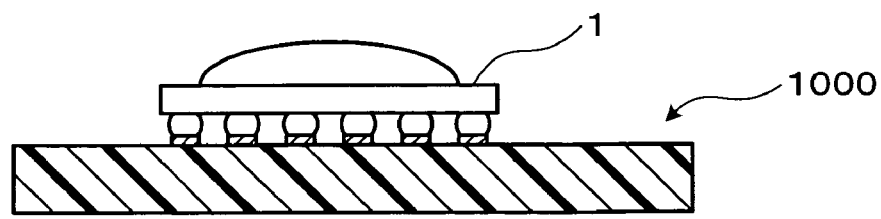
FIG. 14 shows a circuit board on which is mounted an electronic device in accordance with this embodiment.
Figure 15:
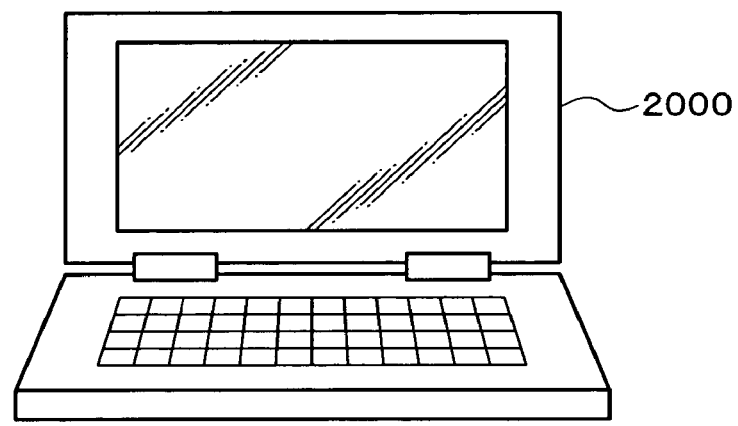
FIG. 15 shows an electronic instrument having an electronic device in accordance with this embodiment.
Figure 16:
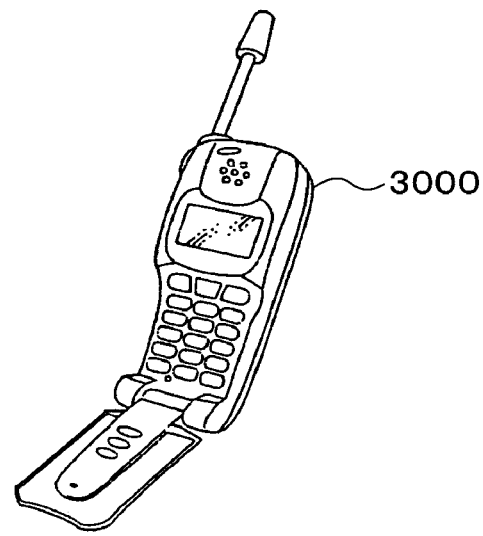
FIG. 16 shows another electronic instrument having an electronic device in accordance with this embodiment.

A circuit board 1000 on which is mounted an electronic device 1 as defined by any of the above-described embodiments is shown in FIG. 14. A notebook-type personal computer 2000 shown in FIG. 15 and a mobile phone 3000 shown in FIG. 16 are examples of electronic instruments having this electronic device.

The present invention is not limited to the above-described embodiments and thus various modifications thereto are possible. For example, the present invention also includes configurations that are substantially the same as the configurations described with reference to the embodiments herein (such as embodiments that have the same function, method, and effect or embodiments that have the same objective and effect). The present invention also includes the substitution of components that mentioned in a non-essential part of the description of the embodiments herein. Furthermore, the present invention also includes configurations that can achieve the same operating effect or the same objective as the embodiments described herein. The present invention further includes configurations wherein known techniques are added to the embodiments described herein.

What is claimed is:

1. An electronic device comprising:
   a substrate on which an interconnect pattern is formed;
   a chip component having a first surface on which an electrode is formed and a second surface opposite to the first surface, the chip component being mounted in such a manner that the second surface faces the substrate, the chip component having a passivation film formed on the first surface;
   an insulating section formed of a resin and provided adjacent to the chip component; and
   an interconnect which is formed to extend from above the electrode, directly on the insulating section, on the passivation film, and above the interconnect pattern, the insulating section being formed so that part of the insulating section under the interconnect does not overlay the first surface.

2. The electronic device as defined by claim 1,
   wherein a side surface of the chip component is inclined to descend in an outward direction from the first surface.

3. The electronic device as defined by claim 1,
   wherein the chip component has a step in an edge portion of the chip component.

4. The electronic device as defined by claim 1,
   wherein the insulating section has a portion higher than the first surface.

5. The electronic device as defined by claim 1, further comprising:
   a connection layer that connects the chip component with the substrate.

6. The electronic device as defined by claim 5,
   wherein the connection layer is formed of the same material as the insulating section.

7. The electronic device as defined by claim 5,
   wherein the connection layer is formed of a material different from a material of the insulating section.

8. An electronic device comprising:
   a substrate on which an interconnect pattern is formed;
   a chip component having a first surface on which an electrode is formed and a second surface opposite to the first surface, the chip component being mounted in such a manner that the second surface faces the substrate, the chip component having a passivation film formed on the first surface;
   an insulating section provided adjacent to the chip component and having an inclined surface descending in an outward direction from the chip component; and
   an interconnect which is formed to extend from above the electrode, directly on the insulating section, on the passivation film, and above the interconnect pattern, the insulating section being formed so that part of the insulating section under the interconnect does not overlay the first surface.

9. The electronic device as defined by claim 8,
   wherein the inclined surface is a depressed surface.

10. The electronic device as defined by claim 8,
    wherein the inclined surface is a projected surface.

11. The electronic device as defined by claim 8,
    wherein the insulating section has a portion higher than the first surface.

12. The electronic device as defined by claim 8, further comprising:
    a connection layer that connects the chip component with the substrate.

13. The electronic device as defined by claim 12,
    wherein the connection layer is formed of the same material as the insulating section.

14. The electronic device as defined by claim 12,
    wherein the connection layer is formed of a material different from a material of the insulating section.

15. A circuit board on which an electronic device as defined in claim 1 is mounted.

16. A circuit board on which an electronic device as defined in claim 8 is mounted.

17. An electronic instrument having an electronic device as defined in claim 1.

18. An electronic instrument having an electronic device as defined in claim 8.

* * * * *